United States Patent [19]
Zhou

[11] Patent Number: 5,395,177
[45] Date of Patent: Mar. 7, 1995

[54] PC BOARD LOCKING DEVICE

[75] Inventor: Yulai Zhou, Jinan, China

[73] Assignee: Langchao Electronic Information Industrial Group Co., Jinan, China

[21] Appl. No.: 61,058

[22] Filed: May 14, 1993

[30] Foreign Application Priority Data

Jun. 2, 1992 [CN] China ................... 92211965.1

[51] Int. Cl.⁶ .................................. F16D 1/00
[52] U.S. Cl. .................... 403/321; 403/256; 403/405.1
[58] Field of Search ............. 403/321, 256, 405.1

[56] References Cited

U.S. PATENT DOCUMENTS 3,608,938 9/1971 Murdock ................. 403/256
4,666,325 5/1987 Vantouroux ............. 403/405.1

FOREIGN PATENT DOCUMENTS

| 5434 | 11/1979 | European Pat. Off. | 403/405 |
| 117217 | 8/1984 | European Pat. Off. | 403/405 |
| 2607201 | 5/1988 | France | 403/405.1 |
| 116010 | 4/1992 | Japan | 403/405.1 |
| 684175 | 9/1979 | U.S.S.R. | 403/405 |

Primary Examiner—John T. Kwon
Attorney, Agent, or Firm—Jacobson, Price, Holman & Stern

[57] ABSTRACT

A PC board locking device has a support frame fixed on a mother board of a computer or other electronic equipment. The frame has upright grooves for receiving respective PC boards and elongated cylindrical insert rods adjacent each groove. Each insert rod has a plate at one end for engaging a PC board and at least one row of barbs along its length which can engage with respective pawls on the frame so that the height of the rods can be adjusted to engage and retain the PC boards.

10 Claims, 2 Drawing Sheets

PC BOARD LOCKING DEVICE

1. Field of the Invention

The present invention relates to a replaceable PC (printed circuit) board locking device, particularly to a device for locking a PC board on a mother—board of a computer or an electronic equipment.

2. Description of the prior art

Replaceable PC boards connected on a mother—board are widely used in computers or electronic equipment. On one side of each PC board there is provided with a standard metal bracket having a fastening notch for fixing the PC board by a screw on a standard retainer.

On the bottom of the PC board there is a standard edge connector for being received by a standard expansion slot on the mother board.

The mother board is also provided with a support frame having a plurality of upright grooves being parallel with each other. The support frame is positioned opposite to said retainer for receiving the other side of the PC board in the groove thereon.

The PC boards may be of various lengths, among which the maximum one equals to the distance between said retainer and said support frame.

Because the side of the PC board received in the groove of said support frame is not locked in said groove, the PC board may be pivoted a Little bit about the fixing screw due to the viberation in transportation. As a result, the edge connector of the PC board will be lifted somewhat from the expansion slot to cause poor contact between the two elements.

OBJECT OF THE INVENTION

The object of the invention is to provide a device being capable of releaseably locking the side of the PC board opposite the metal bracket in the groove of the support frame to ensure a perfect electric connection between the PC board and the mother—board.

SUMMARY OF THE INVENTION

According to the present invention, the above object is realized by a locking device comprising a support frame fixed on a mother board of a computer or an electronic equipment and having a plurality of upright grooves being parallel with each other; an elongated cylindrical insert rod adjacent each one of said grooves, which can be guided by said support frame to slide in a direction substantially parallel with said groove, and is provided with a plate at one of its end for holding said PC board in position; and means for releaseably locking said insert rod with respect to said support frame.

Preferably, said locking means is a one-way locking means comprising at least one row of barbs arranged on the outer surface of said insert rod and at least one resilient ratchet pawl being engageable with said barb, said ratchet pawl being placed on said support frame.

Preferably, the points of said barbs is oriented toward the end of said insert rod with said plate, while the point of said ratchet pawl is oriented toward the end of said insert rod opposite to said plate.

Preferably, the width of said barb is smaller than the diameter of said insert rod. The plate is substantially perpendicular to the longitudinal axis of said insert rod.

Preferably, the phase angle between said plate and said barbs is defined such that the plate is overlaped over said PC board when said ratchet pawl is engaged with said barbs.

It is also preferred that the length of said plate is determined such that the plate can press the PC board in position when said ratchet pawl is engaged with said barbs, and does not interfere with other adjacent insert rods when said insert rod is rotated about its longitudinal axis.

Other objects and advantages of the present invention will become apparent from the following detailed description of a preferred embodiment of the present invention with reference to the accompanying drawings.

DETAILED DESCRIPTION OF THE PREFERRED EMBODIMENT

Figure 1:
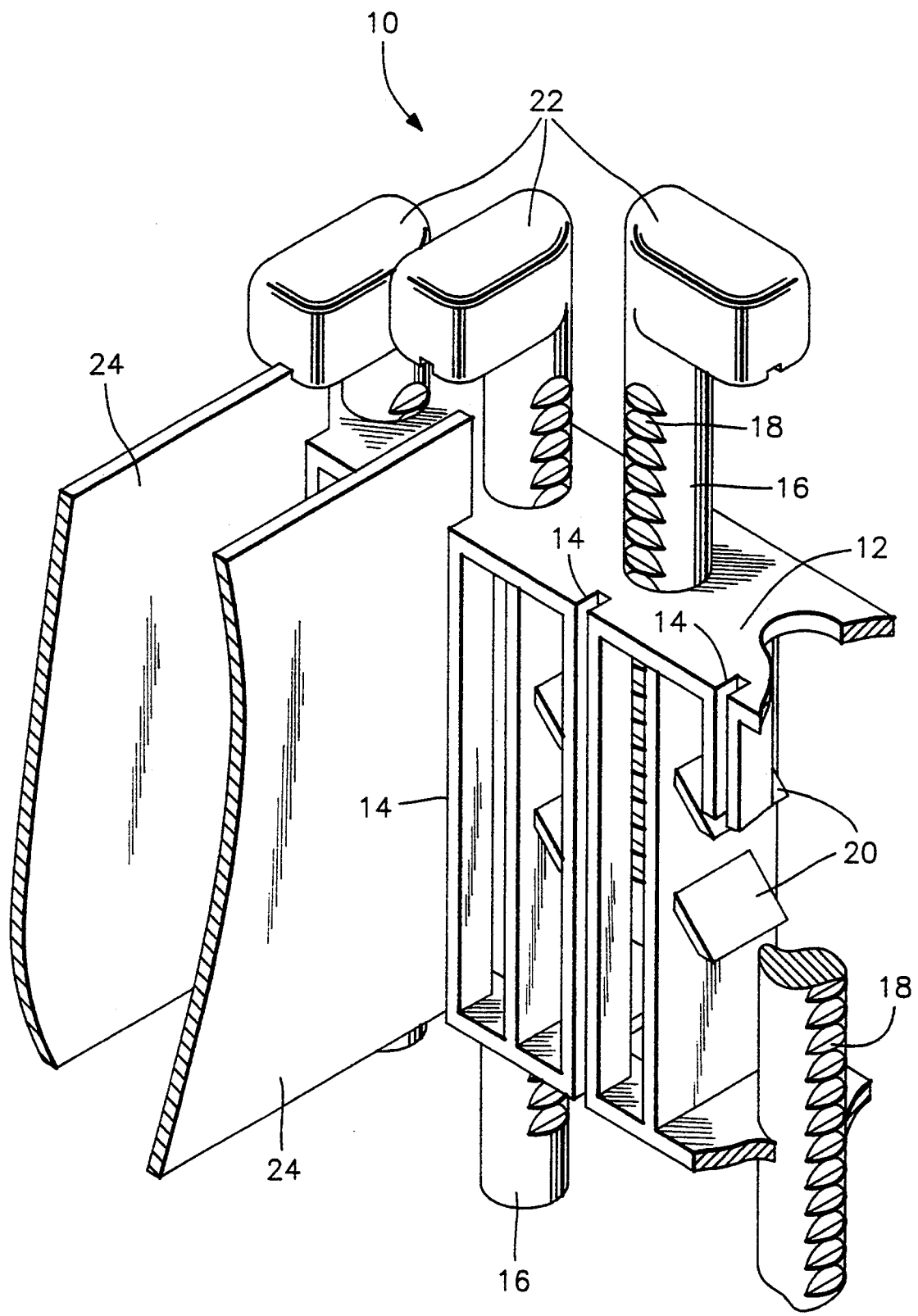
FIG. 1 is a perspective view of a PC board locking device according to the present invention, part of which is cut away.

Referring now to FIGS. 1, 2, 3 and 4, there is shown a locking device 10 of the present invention, which comprises a support frame 12 having a plurality of upright grooves 14 being parallel with each other. An elongated cylindrical insert rod 16 is placed adjacent each one of the grooves 14, said insert rod 16 can be guided by said support frame 12 to slide in a direction substantially parallel with said groove 14 and is provided with a plate 22 at one of its end for holding a PC board 24 in position.

Figure 2:
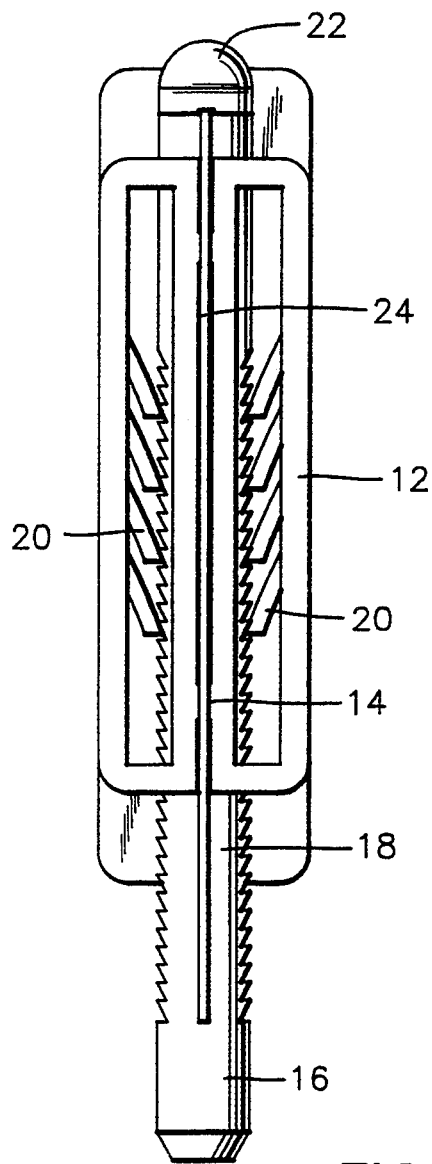
FIG. 2 is an elevation view showing a PC board of the present invention which is locked in position by an insert rod.
Figure 3:
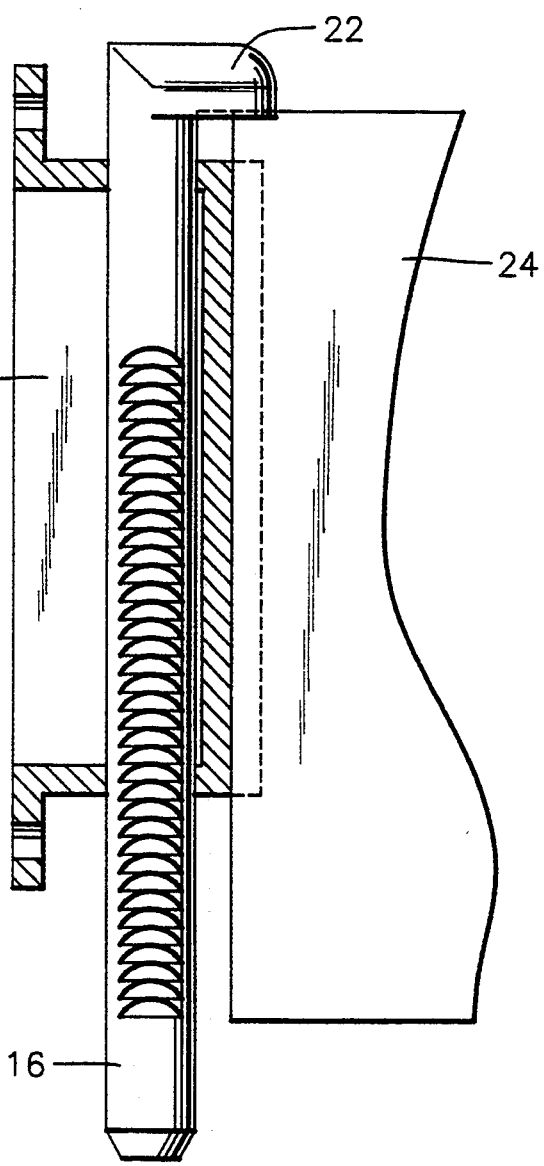
FIG. 3 is a partial side view of the device of the present invention shown in FIG. 2.
Figure 4:
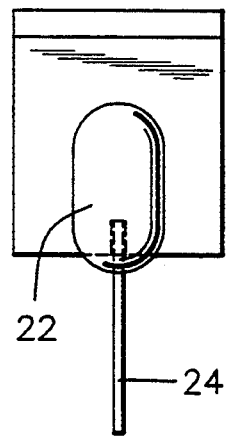
FIG. 4 is a top view of the part of the device shown in FIG. 2.

On the outer surface of said insert rod 16, there is provided with at least one row of barbs 18, preferrably, two rows of barbs 18 diametrically opposite to each other, as shown in FIG. 2.

The support frame 12 has at least one resilient ratchet pawl 20 being engageable with said barbs 18. Preferrably, a pair of ratchet pawls 20 opposite to each other are provided on the support frame 12, and engageable respectively with said two rows of barbs 18.

The points of said barbs 18 are oriented toward the end of said insert rod 16 with said plate 22, while the point of said ratchet pawl 20 is oriented toward the end of said insert rod 16 opposite to said plate 22, as shown in FIG. 2. Therefore, said insert rod 16 can only be moved downwardly when said ratchet pawl 20 is engaged with said barbs 18.

The points of said pair of ratchet pawls 20 are positioned in a plane perpendicular to the longitudinal axis of said insert rod 16.

The width of said barb 18 is smaller than the diameter of said insert rod 16 so that said ratchet pawl 20 can be disengaged from said barbs 18 when said insert rod 16 is rotated a certain angle about its longitudinal axis then said insert rod can be moved both downwardly and upwardly.

The plate 22 is substantially perpendicular to said longitudinal axis of the insert rod 16. The phase angle between said plate 22 and said barbs 18 is defined such that the plate 22 is overlaped over said PC board 24 when said ratchet pawl 20 is engaged with said barbs 18, as shown in FIG. 1.

The length of said plate 22 is determined such that said plate 22 can press said PC board 24 in position when said ratchet pawl 20 is engaged with said barbs 18, and does not interfere with other adjacent insert rods 16 when said insert rod is rotated about its longitudinal axis.

In order to use the locking device of the present invention to hold one or more PC boards on a mother board of a computer or an electronic equipment, an insert rod 16 cooperating with the corresponding groove 14 for receiving one side of a PC board is rotated to disengaged the ratchet pawl 20 from said barbs 18 and pulled upwardly.

Then a PC board can be placed on the mother board with its edge connector being inserted into an expansion slot on the mother board and one of its side being received in the corresponding groove of the support frame.

The insert rod 16 is rotated to bring said barb 18 into engagement with said ratchet pawl 20, whereby said plate 22 is placed above the PC board 24.

Finally said insert rod 16 is pressed downwardly until said plate 22 abuts the top of the PC board 24.

Because of the engagement between the barb 18 and the ratchet pawl 20, said insert rod can not be moved upwardly when said plate 22 is pressed on the top of the PC board. Therefore, the side of the PC board 24 is locked in the corresponding groove 14.

The other side of the PC board 24 having a metal bracket can be fixed on a retainer by a screw through a fastening notch.

In this way, a PC board 24 can be firmly fixed on the mother board to ensure a good contact between the edge connector and the corresponding expansion slot.

The PC board 24 can be disassembed from the mother board only by turning the insert rod 16 about its longitudinal aixs until the ratchet pawl 20 is disengaged from the barb 18 and unscrewing the metal bracket fixed screw.

While a preferred embodiment of the present invention has been described in detail, it will be understood that various modifications and alternations could be made without departing from the spirit and scope of the invention, as set forth in the appended claims.

What we claim is:

1. A device for locking a PC board on a mother board of a computer or other electronic equipment comprising:

a support frame fixed on said mother board and having a plurality of upright grooves parallel with each other;

an insert rod for each one of said grooves, each insert rod being mounted in said support frame adjacent a respective groove to slide axially in a direction substantially parallel with said groove, and being provided with a plate at one end of the rod for holding a PC board in position; and means for releasably locking each insert rod in a selected axial position with respect to said support frame.

2. A device as set forth in claim 1, wherein said locking means is a one-way locking means.

3. A device as set forth in claim 2 wherein said one-way locking means comprises at least one row of barbs arranged on an outer surface of each insert rod, and at least one resilient ratchet pawl being provided on said support frame for each insert rod and engagable with said barbs.

4. A device as set forth in claim 3, wherein the barbs on each insert rod are oriented toward the end of said insert rod with said plate, and said ratchet pawl is oriented toward the end of said insert rod opposite to said plate.

5. A device as set forth in claim 3, wherein the width of each barb is smaller than the diameter of each insert rod.

6. A device as set forth in claim 5, wherein said plate of each insert rod is substantially perpendicular to the longitudinal axis of said insert rod.

7. A device as set forth in claim 6, wherein for each insert rod a phase angle between said plate and said barbs is such that the plate is overlapped over said PC board when said ratchet pawl is engaged with said barbs.

8. A device as set forth in claim 7, wherein the length of said plate is such as to press the PC board in position when said ratched pawl is engaged with said barbs, and not interfere with an adjacent insert rod when said insert rod is rotated about its longitudinal axis.

9. A device as set forth in claim 3, wherein each of said insert rods is provided with two rows of barbs being diametrically opposite to each other, and said support frame is provided with a pair of ratchet pawls for each inset rod engagable with said two rows of barbs, respectively.

10. A device as set forth in claim 9, wherein the points of said ratched pawls are positioned in a plane perpendicular to a longitudinal axis of each said insert rod.

* * * * *